United States Patent
Kim et al.

(10) Patent No.: US 7,384,843 B2
(45) Date of Patent: Jun. 10, 2008

(54) METHOD OF FABRICATING FLASH MEMORY DEVICE INCLUDING CONTROL GATE EXTENSIONS

(75) Inventors: Dong-Chan Kim, Seoul (KR);
Chang-Jin Kang, Suwon-si (KR);
Kyeong-Koo Chi, Seoul (KR);
Seung-Pil Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 259 days.

(21) Appl. No.: 11/260,377

(22) Filed: Oct. 28, 2005

(65) Prior Publication Data

US 2006/0128099 A1 Jun. 15, 2006

(30) Foreign Application Priority Data

Dec. 14, 2004 (KR) .................... 10-2004-0105911

(51) Int. Cl.
*H01L 21/336* (2006.01)
(52) U.S. Cl. .................. 438/257; 438/261; 438/264; 438/593; 257/E21.691
(58) Field of Classification Search ............... 438/258, 438/257, 261, 264, 593
See application file for complete search history.

(56) References Cited

U.S. PATENT DOCUMENTS 6,624,022 B1 * 9/2003 Hurley et al. ............... 438/256
7,115,458 B2 * 10/2006 Rudeck ...................... 438/201
7,122,463 B2 * 10/2006 Ohuchi ....................... 438/624
2004/0061165 A1 * 4/2004 Ding ........................... 257/314
2004/0099900 A1 5/2004 Iguchi et al.

FOREIGN PATENT DOCUMENTS

| JP | 2000-021813 | 1/2000 |
|---|---|---|
| KR | 1020020092234 | 12/2002 |
| KR | 1020040046511 | 6/2004 |

* cited by examiner

*Primary Examiner*—Michael Trinh
(74) *Attorney, Agent, or Firm*—Volentine & Whitt, PLLC

(57) ABSTRACT

A method of manufacturing a semiconductor memory device comprises forming floating gates on active regions of a semiconductor substrate and forming a capping layer on the floating gates. An isolation layer located in the semiconductor substrate between the floating gates is anisotropically etched using the capping layer as an etch mask to form recessed regions. The recessed regions are formed to have a width smaller than a distance between the floating gates, and bottom surfaces positioned below bottom surfaces of the floating gates. Control gate electrodes are formed across the active regions over the floating gates and the control gate electrodes have control gate extensions formed within the recessed regions between the floating gates.

27 Claims, 7 Drawing Sheets

METHOD OF FABRICATING FLASH MEMORY DEVICE INCLUDING CONTROL GATE EXTENSIONS

BACKGROUND OF THE INVENTION

1. Field of the Invention

The present invention relates generally to a method of fabricating a semiconductor memory device. More particularly, the invention relates to a method of fabricating a flash memory device having control gate extensions.

A claim of priority is made to Korean Patent Application No. 2004-105911 filed Dec. 14, 2004, the disclosure of which is hereby incorporated by reference in its entirety.

2. Description of the Related Art

Semiconductor memory devices can be broadly classified in two categories: volatile memory devices and non-volatile memory devices. Volatile memory devices are those that lose stored data when their power supply is interrupted, and non-volatile memory devices are those that retain data even when the power supply is interrupted. Because of their ability to retain stored data even when power is cut off, non-volatile memory devices are commonly employed in various portable, and/or removable devices including, for example, mobile communication devices, memory cards, etc.

One popular class of non-volatile memory devices are flash memory devices. A flash memory device comprises an array of flash memory cells, wherein each of the flash memory cells includes a cell transistor for storing data, and a driver circuit for driving the cell transistor. The cell transistor is formed in specific region of a semiconductor substrate designated as a "cell region" and the driver circuit is generally formed outside the cell region. In a typical flash memory device, the cell region generally contains at least several million cell transistors.

Flash memory devices can be classified into NOR flash memory devices and NAND flash memory devices based on the structure of their cell arrays. NOR flash memory devices have a cell array structure that allows random access to data stored therein. In contrast, the cell array structure in NAND flash memory devices only allows sequential data access to occur. For example, in a NAND flash memory device, data is generally accessed in units defined by "strings" in the device. A string is a structure in which a number of cell transistors is continuously arranged in an-active region having a line shape. Generally, the number of cell transistors in the string is a multiple of 2, e.g., 32. Data stored in the cell transistors is sequentially accessed by asserting a string select line to read out all data stored in the string. Because NAND flash memory devices use sequential data access, they are generally used for mass-storage devices such as various types of memory cards, but they are typically not used as computer memory.

FIG. 1 is a cross-sectional view of a conventional NAND flash memory device taken along the length of a word line in a cell region of the device. Referring to FIG. 1, an isolation layer 7 defining first and second active regions 1A and 1B is formed in a predetermined region of a semiconductor substrate 1. First and second active regions 1A and 1B are formed in parallel with each other and a control gate electrode 13 acting as a word line is formed across first and second active regions 1A and 1B.

Floating gates 10A and 10B are interposed between control gate electrode 13 and active regions 1A and 1B. In particular, a first floating gate 10A is interposed between control gate electrode 13 and first active region 1A, and a second floating gate 10B is interposed between control gate electrode 13 and second active region 1B. Floating gates 10A and 10B are insulated from control gate electrode 13 by an inter-gate dielectric layer 11, and furthermore, floating gates 10A and 10B are insulated from active regions 1A and 1B by a tunnel dielectric layer 3. Control gate electrode 13 also has a control gate extension 13A interposed between floating gates 10A and 10B.

Cell transistors CE1 and CE2 are formed at intersections between control gate electrode 13 and respective active regions 1A and 1B. In particular, a first cell transistor CE1 is formed at an intersection between control gate electrode 13 and first active region 1A, and a second cell transistor CE2 is formed at an intersection between control gate electrode 13 and second active region 1B.

A top surface of isolation layer 7 is generally positioned at a level above bottom surfaces of the floating gates 10A and 10B as shown in FIG. 1. Accordingly, parasitic coupling capacitors using isolation layer 7 as a dielectric layer may be formed between floating gates 10A and 10B. For example, a coupling capacitor C1 is formed by first and second floating gates 10A and 10B with isolation layer 7 interposed therebetween as shown in FIG. 1.

The capacitance of coupling capacitor C1 increases as a distance between floating gates 10A and 10B decreases. In addition, the capacitance of the coupling capacitor C1 increases as an effective cross-sectional area facing between floating gates 10A and 10B increases. As a result, as the degree of integration of NAND flash memory device increases, an inter-floating gate coupling capacitance between floating gates 10A and 10B increases.

Where the coupling capacitance reaches a certain level, it can cause malfunctions to occur in the flash memory device. For example, where first cell transistor CE1 is programmed, electrons are injected into first floating gate 10A to change its electric potential. The change in the electrical potential of first floating gate 10A causes an electric potential of second floating gate 10B adjacent to the first floating gate 10A to change due to coupling capacitor C1. As a result, a threshold voltage of second cell transistor CE2 changes and therefore a string including second cell transistor CE2 may malfunction in a read operation mode.

In order to prevent coupling capacitor C1 from interfering with the operation of first and second floating gates 10A and 10B, methods of extending control gate extension 13A to a level below bottom surfaces of the floating gates 10A and 10B have been investigated. For example, a NAND flash memory device addressing the inter-floating gate coupling capacitance problem and a method of fabricating the same are disclosed in U.S. Patent Application Publication No. 2004/0099900 (the '900 Application).

In the '900 Application, a plurality of control gate electrodes are formed across a plurality of parallel active regions, and floating gates are interposed between the control gate electrodes and the active regions. The floating gates are insulated from the active regions by a tunnel dielectric layer. Each of the control gate electrodes has extensions penetrating an isolation layer between the floating gates to levels below top surfaces of the active regions.

One problem with the approach taken by the '900 Application, however, is that a process of partially etching the isolation layer is required to form the extensions. The process of partially etching the isolation layer includes a wet etching process and a dry etching process. Unfortunately, it is very difficult to precisely control the depth of the etching produced by wet etching process. Where the wet etching process causes the isolation layer to be over etched, undercut regions can occur at lower regions of the floating gates and the tunnel dielectric layer can be damaged. In addition, the undercut regions can also cause a stringer defect when the control gate electrode is formed. Furthermore, the dry etching process uses the floating gates as etching masks, with the result that the floating gates and the tunneling dielectric layer may be damaged by plasma used in the dry etching process. Accordingly, exposed surfaces of the floating gates may be etched by the dry etching gas. Finally, the tunnel dielectric layer may be contaminated or damaged in the dry etching process due to a plasma transmission phenomenon.

SUMMARY OF THE INVENTION

According to one embodiment of the invention, a method of fabricating a flash memory device is provided. The method comprises forming a trench region defining a plurality of parallel active regions in a semiconductor substrate, forming an isolation layer in the trench region, forming floating gate patterns on the active regions, and forming a capping layer on exposed surfaces of the isolation layer and the floating gate patterns. The method further comprises anisotropically etching the capping layer to expose the isolation layer between the floating gate patterns, anisotropically etching the exposed isolation layer using the capping layer as an etch mask to form recessed regions, and removing the capping layer to expose the floating gate patterns. The method still further comprises forming an inter-gate dielectric layer on the semiconductor substrate over the recessed regions and the floating gate patterns, and forming a control gate conductive layer on the inter-gate dielectric layer. Finally, the method further comprises sequentially patterning the control gate conductive layer, the inter-gate dielectric layer, and the floating gate patterns to form (1) a plurality of control gate electrodes across the active regions; and, (2) a plurality floating gates between the control gate electrodes and the active regions, wherein each of the control gate electrodes comprises a control gate extension formed between the floating gates.

BRIEF DESCRIPTION OF THE DRAWINGS

The invention is described below in relation to several embodiments illustrated in the accompanying drawings. Throughout the drawings like reference numbers indicate like exemplary elements, components, or steps. In addition, the thickness of layers has been exaggerated for clarity of illustration. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
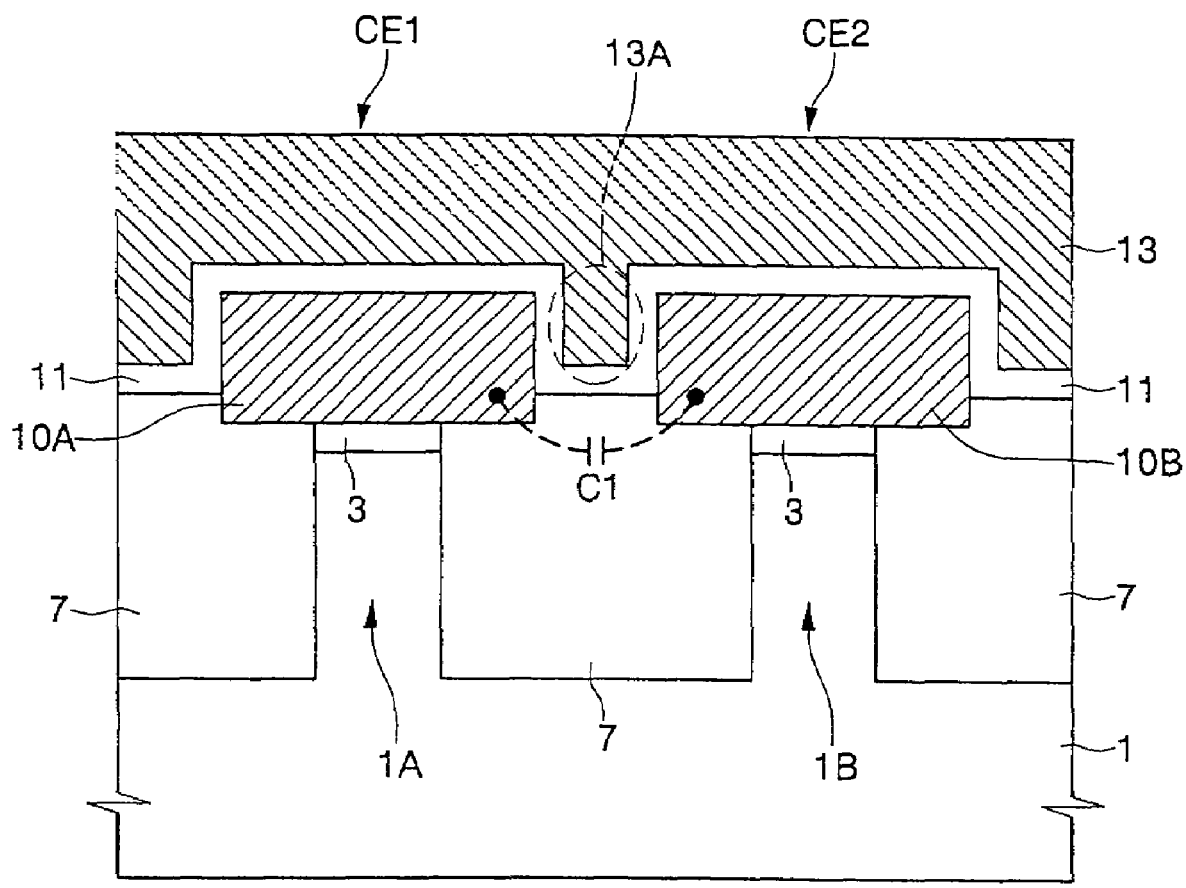
FIG. 1 is a cross-sectional view of a conventional NAND flash memory device taken along the length of a word line in a cell region of the device.
Figure 2:
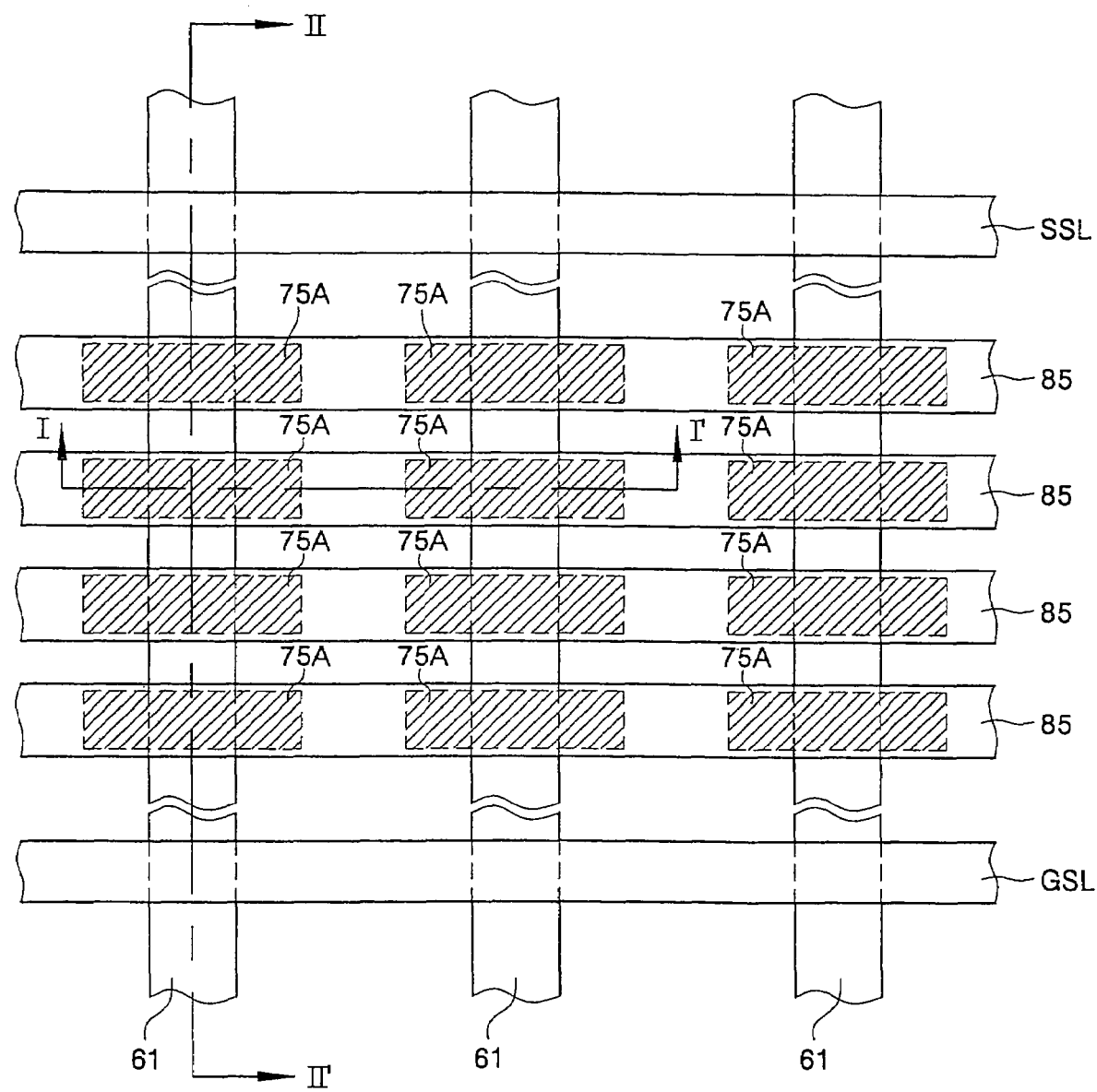
FIG. 2 is a planar view showing part of a cell array region of a NAND flash memory device in accordance with an embodiment of the present invention.

FIG. 2 is a planar view of a part of a cell array region of a NAND flash memory device in accordance with an embodiment of the present invention. FIGS. 3 through 9 are cross-sectional views taken along a line between I and I' in FIG. 2 and illustrating a method of fabricating a NAND flash memory device in accordance with an embodiment of the present invention. FIG. 10 is a cross-sectional view taken along line between II and II' in FIG. 2 and illustrating a method of fabricating a NAND flash memory device in accordance with another embodiment of the present invention.

Figure 3:
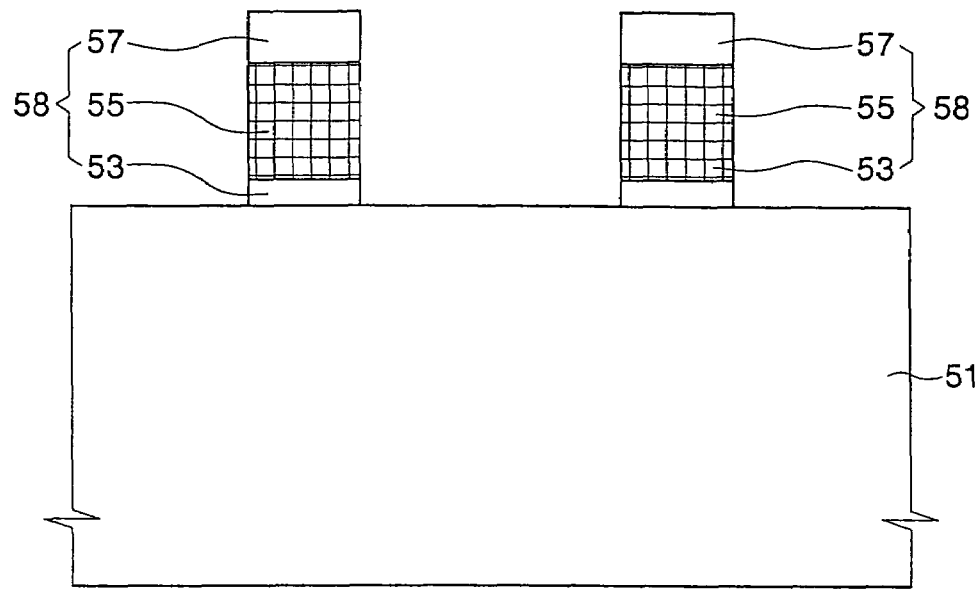
FIGS. 3 through 9 are cross-sectional views illustrating a method of fabricating a NAND flash memory device in accordance with an embodiment of the present invention.

Referring to FIGS. 2 and 3, a trench mask layer is formed on a semiconductor substrate 51. The trench mask layer is formed by sequentially stacking a buffer layer, a chemical mechanical polishing (CMP) stopper, and a hard mask layer on semiconductor substrate 51. Alternatively, the hard mask layer can be omitted from the trench mask layer. The buffer layer is formed to alleviate physical stress generated by a difference between thermal expansion coefficients of the CMP stopper and semiconductor substrate 51.

The buffer layer is generally formed of a silicon oxide layer such as a thermal oxide layer and the CMP stopper is typically formed of a material layer having an etch selectivity relative to the buffer layer. For example, the CMP stopper may be formed of a silicon nitride (SiN) layer using chemical vapor deposition (CVD). The hard mask layer is typically formed of an insulating layer having an etch selectivity relative to the CMP stopper and semiconductor substrate 51. For example, the hard mask layer could be formed of a silicon oxynitride (SiON) layer using the CVD method. The hard mask layer acts to suppress diffuse reflections in a photolithography process to facilitate formation of a fine pattern.

The hard mask layer, the CMP stopper, and the buffer layer are sequentially patterned to form a plurality of parallel trench mask patterns 58 exposing predetermined regions of semiconductor substrate 51. Accordingly, each of trench mask patterns 58 is formed with a buffer layer pattern 53, a CMP stopping pattern 55, and a hard mask pattern 57 which are sequentially stacked. Where the hard mask layer is omitted from the trench mask layer, hard mask pattern 57 is likewise absent from each of trench mask patterns 58. The patterning process used to form trench mask patterns 58 typically includes processes of forming a photoresist pattern on the trench mask layer and etching the trench mask layer using the photoresist pattern as an etch mask.

Figure 4:
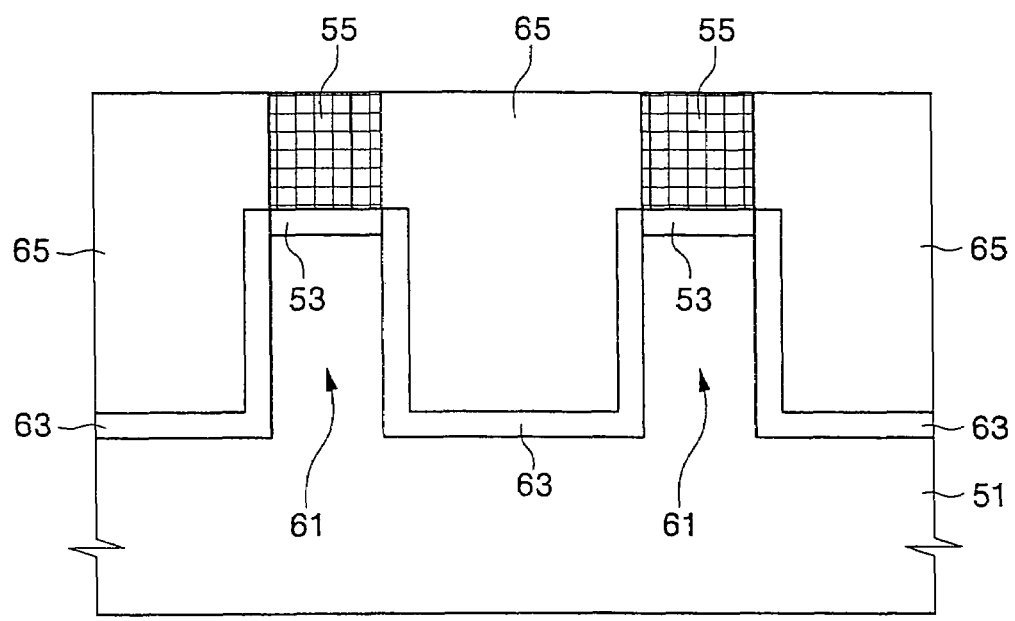

Referring to FIGS. 2 and 4, semiconductor substrate 51 is etched using trench mask patterns 58 as an etch mask to form a trench region defining a plurality of parallel active regions 61. Each of active regions 61 may be shaped as a trapezoid in which a bottom width is larger than a top width, however, for simplicity of description, it is assumed that active regions 61 are shaped as rectangles having the same bottom width and top width. Sidewall oxide layers 63 are optionally formed on sidewalls of active regions 61 and on bottom surfaces of the trench region. Sidewall oxide layers 63 are formed using a thermal oxidation process.

An insulating layer is formed to completely fill the trench region and cover the entire surface of semiconductor substrate 51. The insulating layer is typically formed of a silicon oxide layer using a CVD method or a high density plasma CVD (HDPCVD) method. A silicon oxide layer formed by the HDPCVD method is referred to as hereafter as a "HDP oxide layer". The insulating layer is planarized until top surfaces of CMP stopping patterns 55 are exposed to form an insulating layer pattern 65. The planarization is generally performed by a chemical mechanical polishing (CMP) process using CMP stopping patterns 55 as stop layers. Consequently, top surfaces of CMP stopping patterns 55 insulating layer pattern 65 are exposed on the substantially same plane. Where trench mask patterns 58 include hard mask pattern 57, hard mask pattern 57 is removed during the planarization process.

Figure 5:
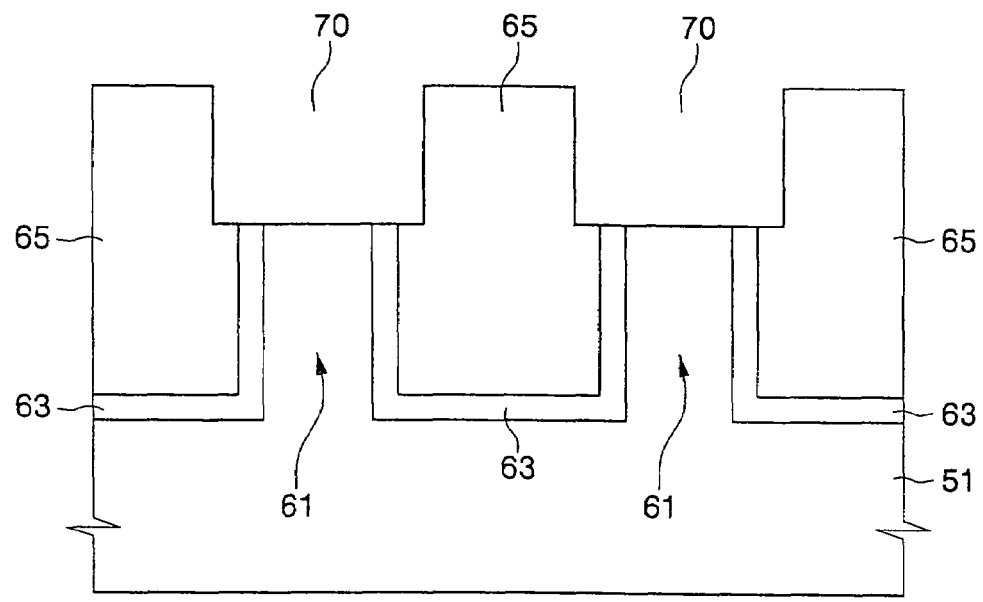

Referring to FIGS. 2 and 5, CMP stopping patterns 55 are selectively removed to expose buffer layer patterns 53. Where CMP stopping patterns 55 are formed of a silicon nitride (SiN) layer, CMP stopping patterns 55 may be selectively etched by a wet etching process using a phosphoric acid ($H_3PO_4$) solution. The wet etching process using the $H_3PO_4$ solution has a high etch rate with respect to the silicon nitride (SiN) layer.

In the wet etching process, buffer layer patterns 53 and insulating layer 65 act as etch stop layers. Subsequently, buffer layer patterns 53 are removed to form grooves 70 exposing active regions 61. Where buffer layer patterns 53 are formed of a silicon oxide layer such as a thermal oxide layer, buffer layer patterns 53 are generally removed using an oxide etchant such as a wet etching solution containing hydrofluoric acid (HF). Where both buffer layer patterns 53 and insulating layer pattern 65 are formed of a silicon oxide layer, insulating layer pattern 65 is isotropically etched while buffer layer patterns 53 are removed. Where buffer layer patterns 53 are formed of a silicon oxide layer using a thermal oxidation process and insulating layer pattern 65 is formed of a HDP oxide layer, the etch rate of insulating layer pattern 65 will be higher than the etch rate of buffer layer patterns 53 with respect to the oxide etchant. In other words, insulating layer pattern 65 will be etched faster than buffer layer patterns 53. Consequently, grooves 70 may be formed to have larger widths than top widths of active regions 61. In addition, grooves 70 may be self-aligned on active regions 61.

Figure 6:
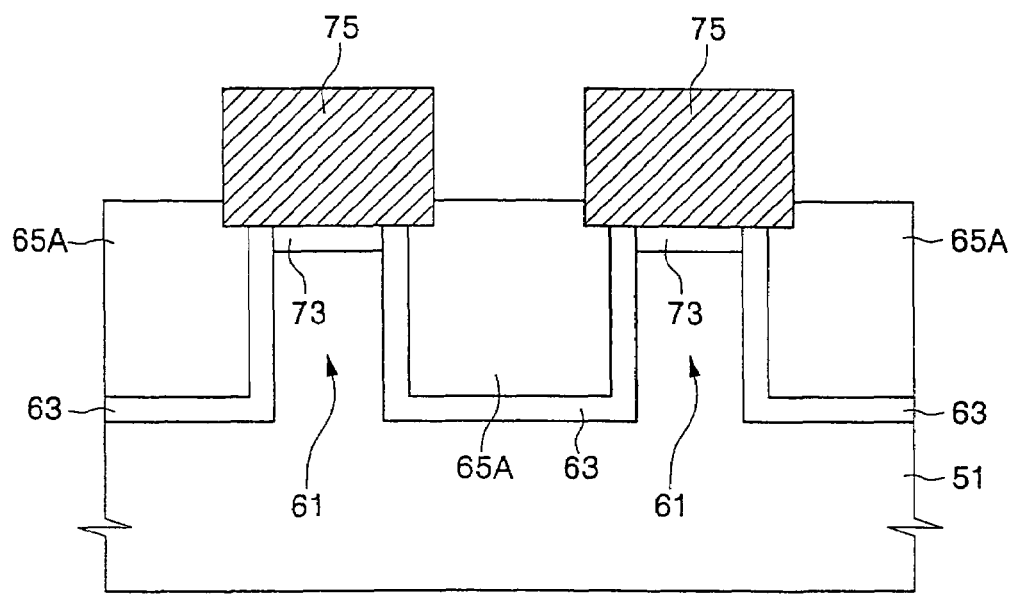

Referring to FIGS. 2 and 6, tunnel dielectric layers 73 are formed on exposed surfaces of active regions 61. Tunnel dielectric layers 73 are generally formed using a thermal oxidation process.

A floating gate conductive layer is formed on semiconductor substrate 51 over tunnel dielectric layer 73. The floating gate conductive layer generally comprises a doped polysilicon layer. The floating gate conductive layer is planarized to expose top surfaces of insulating layer pattern 65. In general, the planarization is performed by a CMP process using insulating layer pattern 65 as a stop layer. Alternatively, an etch back process may be used to perform the planarization. Consequently, floating gate patterns 75 having flat top surfaces are formed within grooves 70. Floating gate patterns 75 generally have larger widths than top widths of active regions 61. Alternatively, floating gate patterns 75 may be self-aligned (i.e., have substantially the same width and alignment) with active regions 61.

Subsequently, insulating layer pattern 65 is selectively etched using floating gate patterns 75 as an etch mask to form an isolation layer 65A. Insulating layer pattern 65 is generally removed by a wet etching process using an oxide etchant containing HF. Preferably, isolation layer pattern 65A is formed so that a top surface thereof has a same or higher level than bottom surfaces of floating gate patterns 75. Where insulating layer pattern 65 is over etched, i.e., where a top surface thereof is lower a bottom surface of floating gate patterns 75, undercut regions may occur at lower regions of floating gate patterns 75. The undercut regions may cause leakage current, and should therefore be avoided where possible.

Figure 7:
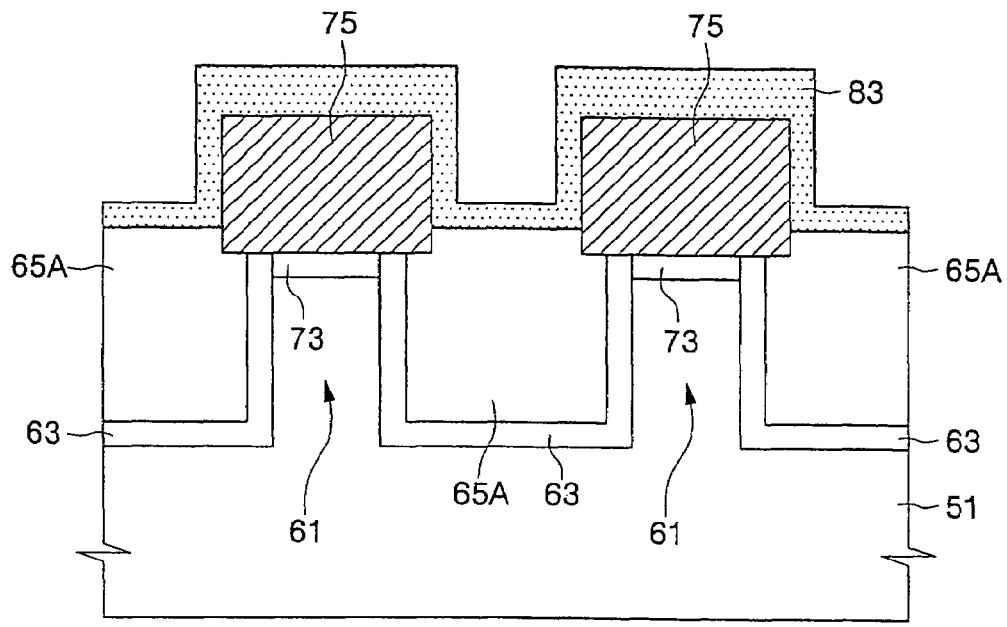

Referring to FIGS. 2 and 7, a capping layer 83 is formed on exposed surfaces of isolation layer 65A and floating gate patterns 75. Capping layer 83 is preferably formed of a material layer having an etch selectivity relative to isolation layer 65A.

Capping layer 83 is preferably formed under processing conditions such that it has a different thickness on top of isolation layer 65A and floating gate patterns 75. In particular, capping layer 83 is preferably formed to be thicker on top of floating gate patterns 75 and thinner on isolation layer 65A and sidewalls of floating gate patterns 75.

Capping layer 83 is preferably formed of at least one layer selected from a group consisting of a SiN layer, a SiON layer, an amorphous carbon layer, and a silicon germanium (SiGe) layer. For example, capping layer 83 may be formed of a SiN or SiON layer using a CVD method. In addition, capping layer 83 may be formed of a SiGe layer using a selective epitaxy growing method. The SiGe layer formed using the selective epitaxy growing method may be selectively formed on the exposed surfaces of floating gate patterns 75.

Figure 8:
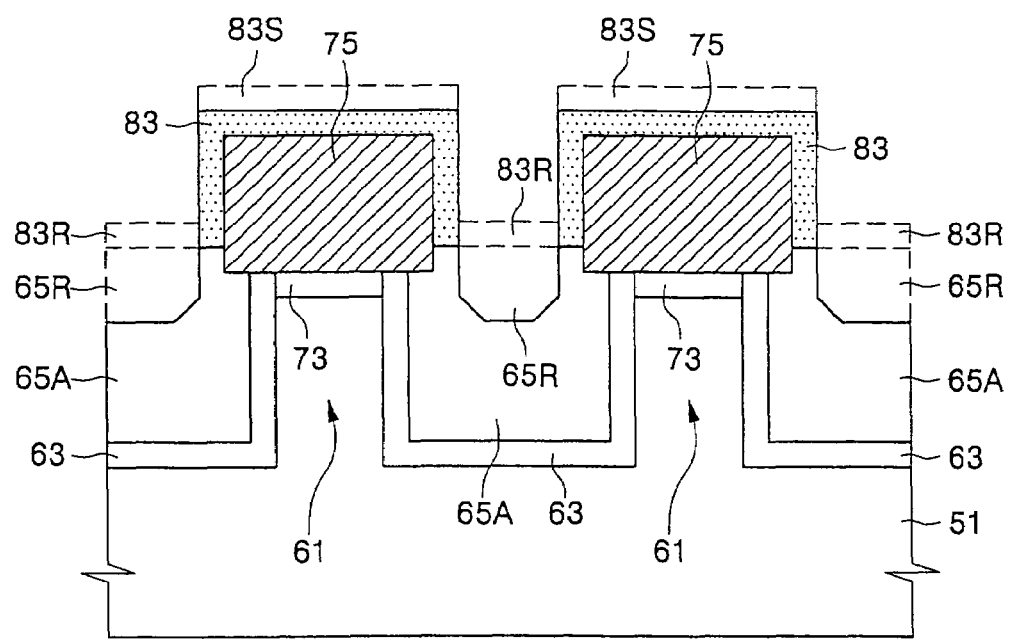

Referring to FIGS. 2 and 8, capping layer 83 is anisotropically etched to expose isolation layer 65A between floating gate patterns 75. While the anisotropic etching is carried out, capping layer 83 formed over isolation layer 65A is recessed downward so that openings 83R are formed on isolation layer 65A. Because the etching process is anisotropic, capping layer 83 remains on sidewalls of floating gate patterns 75. Accordingly, widths of openings 83R are formed to be narrower than a distance between floating gate patterns 75 because of capping layer 83 remaining on the sidewalls of floating gate patterns 75. Similarly, the exposed surface of isolation layer 65A is formed to have a width smaller than the distance between floating gate patterns 75.

In the anisotropic etching process, capping layer 83 on top of floating gate patterns 75 is also etched. However, since the thickness of capping layer 83 on top of floating gate patterns 75 is greater than the thickness of capping layer 83 on isolation layer 65A, some of capping layer 83 remains on floating gate patterns 75 after the anisotropic etching process. An amount 83S of capping layer 83 having approximately the same thickness as capping layer 83 on isolation layer 65A is removed from the top of floating gate patterns 75 in the anisotropic etching process.

Subsequently, exposed isolation layer 65A is anisotropically etched using capping layer 83 as an etch mask to form recessed regions 65R. In this case, the anisotropic etching may be carried out using a dry etching process. Recessed regions 65R are formed to have a width smaller than the distance between floating gate patterns 75 and bottom surfaces positioned at a level below bottom surfaces of floating gate patterns 75.

Each of recessed-regions 65R is formed with a "V" or "U" shape. Accordingly, undercut regions are prevented from occurring at lower regions of floating gate patterns 75, and a sufficient amount of isolation layer 65A is interposed between active regions 61 and the recessed regions 65R to prevent damage to active regions 61. In addition, floating gate patterns 75 are protected against etching damage even when a dry etching process using plasma is performed. This is because capping layer 83 acts to protect floating gate patterns 75 while the dry etching process is carried out.

After recessed regions 65R are formed, capping layer 83 is removed to expose floating gate patterns 75.

Figure 9:
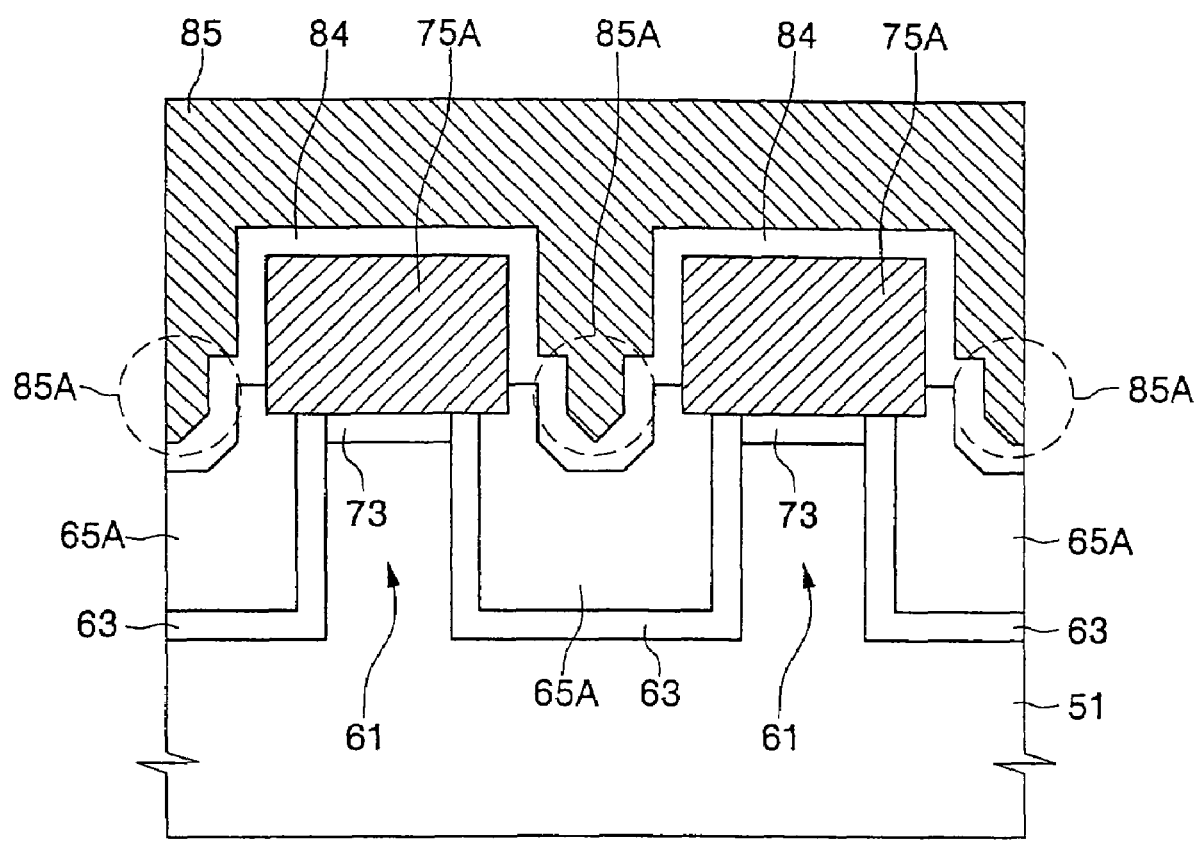
Figure 10:
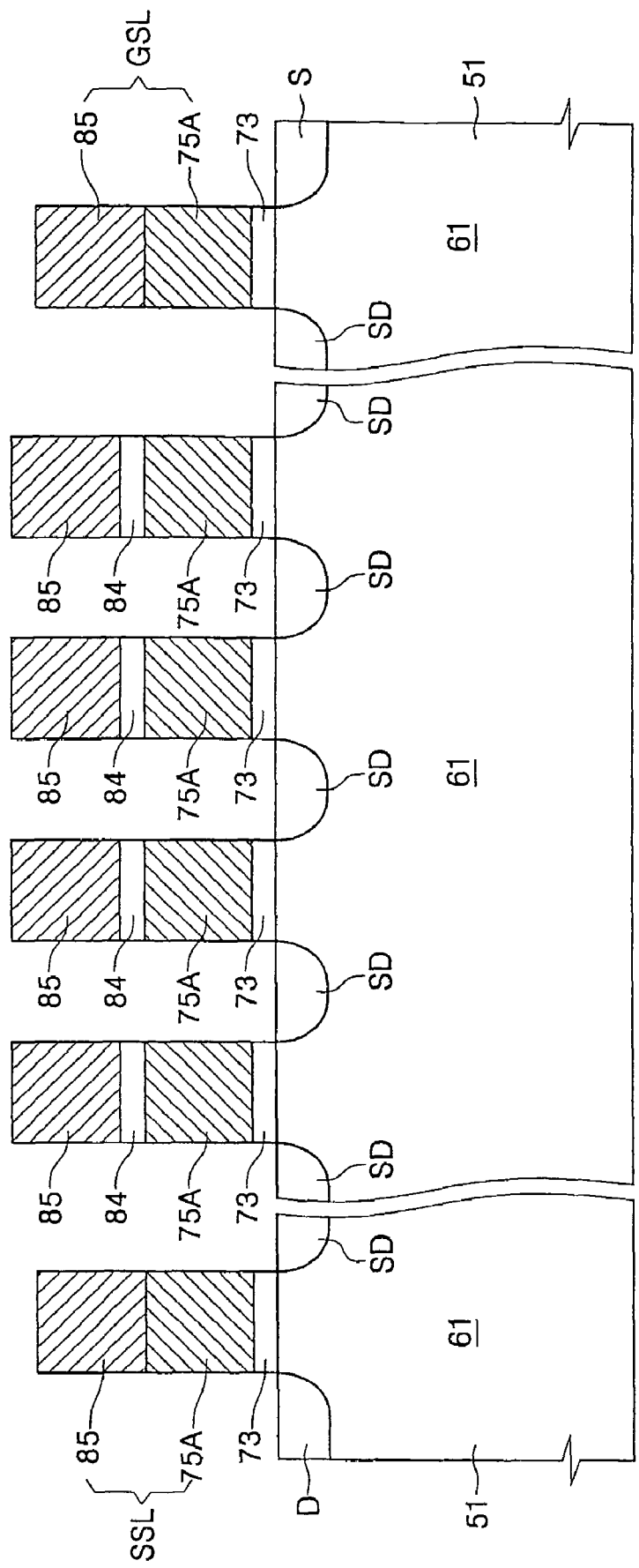
FIG. 10 is a cross-sectional view illustrating a method of fabricating a NAND flash memory device according to another embodiment of the present invention.

Referring to FIGS. 2 and 9, an inter-gate dielectric layer 84 and a control gate conductive layer are sequentially formed on semiconductor substrate 51 over recessed regions 65R and floating gate patterns 75. The control gate conductive layer, inter-gate dielectric layer 84, and floating gate patterns 75 are sequentially patterned to form not a plurality of control gate electrodes 85 across active regions 61 and floating gates 75A interposed between control gate electrodes 85 and active regions 61.

Inter-gate dielectric layer 84 is typically formed of a multilayer such as an oxide-nitride-oxide (ONO) layer, an aluminum oxide ($Al_2O_3$) layer, a hafnium oxide ($HfO_2$) layer, a $HfO_2$—$Al_2O_3$ layer, or a silicon oxide ($SiO_2$)—$HfO_2$—$Al_2O_3$ layer, and the control gate conductive layer is typically formed of a doped polysilicon layer or a polycide layer. Inter-gate dielectric layer 84 is formed over top surfaces and sidewalls of floating gate patterns 75 and it extends to cover isolation layer 65A.

Control gate extensions 85A filling recessed regions 65R are formed while control gate electrodes 85 are formed. Each of control gate extensions 85A typically has a "V" or "U" shape. Preferably, control gate extensions 85A extend to a level below lower surfaces of floating gates 75A. The lower levels of control gate extensions 85A may be adjusted by controlling corresponding depths of recessed regions 65R. For example, where bottom surfaces of recessed regions 65R are formed at a level below lower regions of floating gates 75A, control gate extensions 85A may extend to a level below the bottom surfaces of floating gates 75A. Accordingly, control gate extensions 85A shield an electric field resulting from a potential difference between adjacent floating gates 75A adjacent to each other even when floating gates 75A have different electric potentials from each other. As a result, control gate extensions 85A significantly reduce parasitic coupling capacitance between floating gates 75A.

Referring to FIGS. 2 and 10, a string select line SSL and a ground select line GSL may be formed across active regions 61 using a conventional method. For instance, string select line SSL and ground select line GSL could be simultaneously formed while control gate electrodes 85 are formed, or they could be formed prior to or after the formation of control gate electrodes 85.

In FIG. 10, string select line SSL and ground select line GSL are formed of floating gates 75A and control gate electrodes 85 which are sequentially stacked. Tunnel dielectric layer 73 is formed between string select line SSL and active regions 61 in order to act as a gate dielectric layer of a string select transistor. Tunnel dielectric layer 73 is also formed between ground select line GSL and active regions 61 in order to act as a gate dielectric layer of a ground select transistor.

String select line SSL and ground select line GSL are formed in parallel with each other when seen from a planar view as shown in FIG. 2. In this case, a plurality of control gate electrodes 85 formed across active regions 61 are formed between string select line SSL and ground select line GSL. A plurality of floating gates 75A are formed between control gate electrodes 85 and active regions 61. In other words, floating gates 75A are arranged in a two-dimensional manner along rows parallel to control gate electrodes 85 and columns parallel to active regions 61.

Impurity ions are implanted into active regions 61 using control gate electrodes 85 as ion implantation masks to form source and drain regions "SD". Source and drain regions "SD" are formed within active regions 61 between floating gates 75A. Consequently, cell transistors are formed at intersections between control gate electrodes 85 and active regions 61. Bit line impurity regions "D" and common source regions "S" shown in FIG. 10 are typically formed while source and drain regions "SD" are formed. In particular, bit line impurity regions "D" are generally formed within active regions 61 adjacent to string select line SSL and are positioned opposite to ground select line GSL. Common source regions "S" are generally formed within active regions 61 which are adjacent to ground select line GSL and are positioned opposite to string select line SSL. Bit line impurity regions "D" act as drain regions for the string select transistors and common source regions "S" act as source regions for the ground select transistors. Consequently, the string select transistors are formed at intersections between string select line SSL and active regions 61, and the ground select transistors are formed at intersections between ground select line GSL and active regions 61.

Once source and drain regions "SD", common source regions "S", and bit line impurity regions "D" are formed, the manufacture of the NAND flash memory device may be completed by performing any of a number of conventionally known fabrication processes, including forming an insulating interlayer, a drain contact plug, a bit line, etc.

According to selected embodiments of the present invention described above, floating gates are formed on active regions of a semiconductor substrate, and a capping layer is formed on the floating gates. An isolation layer located in the semiconductor substrate between the floating gates is anisotropically etched using the capping layer as an etch mask to form recessed regions. The recessed regions are formed to have a width smaller than a distance between the floating gates, and bottom surfaces positioned below bottom surfaces of the floating gates.

Control gate electrodes are formed across the active regions over the floating gates. The control gate electrodes have control gate extensions formed within the recessed regions between the floating gates. Lower regions of the control gate extensions preferably extend below bottom surfaces of the floating gates in order to shield an electric field resulting from a potential difference between adjacent floating gates. Accordingly, the control gate extensions act to reduce parasitic coupling capacitance between the floating gates. Consequently, mutual disturbance between adjacent cell transistors is prevented to improve the reliability of highly integrated flash memory devices.

Although various embodiments of the present invention have been described in the context of a NAND flash memory device, the teachings presented with respect to these embodiments are readily applicable to other forms of flash memory such as NOR flash.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. A method of fabricating a flash memory device, the method comprising:

forming a trench region defining a plurality of parallel active regions in a semiconductor substrate;

forming an isolation layer in the trench region;

forming floating gate patterns separated by a first width on the active regions;

forming a capping layer on exposed surfaces of the isolation layer and the floating gate patterns;

anisotropically etching the capping layer to expose the isolation layer between the floating gate patterns, wherein sidewall and upper surfaces of the floating gate patterns remain covered by a residual etched portion of the capping layer;

anisotropically etching the exposed isolation layer using the residual etched portion of the capping layer as an etch mask to form a recessed region between the floating gate patterns having a maximum width less than the first width;

removing the residual etched portion of the capping layer to expose the floating gate patterns;

forming an inter-gate dielectric layer over the recessed region and the floating gate patterns;

forming a control gate conductive layer on the inter-gate dielectric layer; and, sequentially patterning the control gate conductive layer, the inter-gate dielectric layer, and the floating gate patterns to form a plurality of control gate electrodes across the active regions; and a plurality floating gates between the control gate electrodes and the active regions;

wherein each of the control gate electrodes comprises a control gate extension formed between the floating gate patterns.

2. The method of claim 1, wherein forming the trench region comprises:

forming a plurality of parallel trench mask patterns on the semiconductor substrate; and, etching the semiconductor substrate using the trench mask patterns as an etch mask.

3. The method of claim 2, wherein each of the trench mask patterns comprises a buffer layer pattern and a chemical mechanical polishing (CMP) stopping pattern formed on the buffer layer pattern.

4. The method of claim 3, wherein the CMP stopping pattern is formed of a material having an etch selectivity relative to the buffer layer pattern.

5. The method of claim 3, wherein the buffer layer pattern comprises a silicon oxide layer and the CMP stopping pattern comprises a silicon nitride layer.

6. The method of claim 3, wherein each of the trench mask patterns further comprises:

a hard mask pattern formed on the CMP stopping pattern.

7. The method of claim 1, further comprising:

forming a sidewall oxide layer on sidewalls of the active regions after forming the trench region.

8. The method of claim 3, wherein forming the floating gate patterns comprises:

forming an insulating layer pattern filling the trench region and having top surfaces exposed on a common plane with the trench mask patterns;

selectively removing the CMP stopping pattern to expose the buffer layer pattern;

isotropically etching the buffer layer pattern to form grooves exposing the active regions and having widths larger than the active regions;

forming a tunnel dielectric layer on the exposed active regions;

forming a floating gate conductive layer on the semiconductor substrate and filling the grooves; and, planarizing the floating gate conductive layer until a top surface of the insulating layer pattern is exposed.

9. The method of claim 8, wherein forming the isolation layer comprises:

selectively etching the insulating layer pattern to a level at or above bottom surfaces of the floating gate patterns.

10. The method of claim 1, wherein the capping layer is formed of a material having an etch selectivity relative to the isolation layer.

11. The method of claim 1, wherein the capping layer comprises a silicon nitride (SiN) layer, a silicon oxynitride (SiON) layer, an amorphous carbon layer, or a silicon germanium (SiGe) layer.

12. The method of claim 1, wherein a bottom surface of the recessed region is disposed below bottom surfaces of the floating gate patterns.

13. The method of claim 1, wherein the inter-gate dielectric layer comprises an oxide-nitride-oxide (ONO) layer.

14. The method of claim 1, wherein each of the control gate extensions has a lower region disposed below bottom surfaces of the floating gates.

15. The method of claim 14, wherein each lower region has a "V" shape or "U" shape.

16. A method of forming a NAND flash memory device, the method comprising:

forming a plurality of parallel trench mask patterns on a semiconductor substrate;

etching the semiconductor substrate using the trench mask patterns as an etch mask to form a trench region defining a plurality of parallel active regions in the semiconductor substrate;

forming an insulating layer pattern filling the trench region;

removing the trench mask patterns to form grooves having widths greater than the active regions and exposing the active regions;

forming insulated floating gate patterns filling the grooves and separated by a first width on the active regions;

selectively etching the insulating layer pattern between the floating gate patterns to form an isolation layer having an upper surface level with or above bottom surfaces of the floating gate patterns;

forming a capping layer on exposed surfaces of the isolation layer and the floating gate patterns;

anisotropically etching the capping layer to expose the isolation layer between the floating gate patterns, wherein sidewall and upper surfaces of the floating gate patterns remain covered by a residual etched portion of the capping layer;

anisotropically etching the exposed isolation layer using the residual etched portion of the capping layer as an etch mask to form recessed regions separating adjacent floating gate patterns, wherein each recessed region has a maximum width less than the first width;

removing the residual etched portion of the capping layer to expose the floating gate patterns and the isolation layer;

sequentially forming an inter-gate dielectric layer and a control gate conductive layer on the isolation layer and the floating gate patterns; and, sequentially patterning the control gate conductive layer, the inter-gate dielectric layer, and the floating gate patterns to form a plurality of control gate electrodes across the active regions, and a plurality of floating gates interposed between the control gate electrodes and the active regions;

wherein each of the control gate electrodes is formed with control gate extensions penetrating between adjacent floating gates.

17. The method of claim 16, wherein each of the trench mask patterns comprises:

a buffer layer pattern; and, a CMP stopping pattern formed on the buffer layer pattern.

18. The method of claim 17, wherein the CMP stopping pattern is formed of a material having an etch selectivity relative to the buffer layer pattern.

19. The method of claim 17, wherein the buffer layer pattern comprises a silicon oxide layer and the CMP stopping pattern comprises a silicon nitride layer.

20. The method of claim 17, wherein each of the trench mask patterns further comprises a hard mask pattern formed on the CMP stopping pattern.

21. The method of claim 16, further comprising:
forming a sidewall oxide layer on sidewalls of the active regions after forming the trench region.

22. The method of claim 16, wherein the capping layer is formed of a material having an etch selectivity relative to the isolation layer.

23. The method of claim 16, wherein the capping layer comprises a silicon nitride (SiN) layer, a silicon oxynitride (SiON) layer, an amorphous carbon layer, or a silicon germanium (SiGe) layer.

24. The method of claim 16, wherein bottom surfaces of the recessed regions are disposed below bottom surfaces of the floating gates.

25. The method of claim 16, wherein the inter-gate dielectric layer comprises an oxide-nitride-oxide (ONO) layer.

26. The method of claim 16, wherein each of the control gate extensions has a lower region positioned at a level below bottom surfaces of the floating gates.

27. The method of claim 26, wherein each lower region has a "V" shape or "U" shape.

* * * * *